(12) United States Patent
Rusconi Clerici Beltrami et al.

(10) Patent No.: US 10,826,445 B2
(45) Date of Patent: Nov. 3, 2020

(54) AMPLIFIER UNIT FOR OPERATING A PIEZOELECTRIC SOUND TRANSDUCER AND/OR A DYNAMIC SOUND TRANSDUCER, AND A SOUND-GENERATING UNIT

(71) Applicant: USOUND GMBH, Graz (AT)

(72) Inventors: Andrea Rusconi Clerici Beltrami, Vienna (AT); Ferruccio Bottoni, Graz (AT); Markus Haensler, Graz (AT)

(73) Assignee: USOUND GMBH, Graz (AT)

( * ) Notice: Subject to any disclaimer, the term of this patent is extended or adjusted under 35 U.S.C. 154(b) by 0 days.

(21) Appl. No.: 16/345,428

(22) PCT Filed: Oct. 25, 2017

(86) PCT No.: PCT/EP2017/077250
§ 371 (c)(1),
(2) Date: Apr. 26, 2019

(87) PCT Pub. No.: WO2018/077922
PCT Pub. Date: May 3, 2018

(65) Prior Publication Data
US 2019/0253026 A1   Aug. 15, 2019

(30) Foreign Application Priority Data
Oct. 27, 2016 (DE) .................. 10 2016 120 545

(51) Int. Cl.
*H03F 3/185* (2006.01)
*H04R 3/00* (2006.01)
(Continued)

(52) U.S. Cl.
CPC ............ *H03F 3/185* (2013.01); *H03G 3/007* (2013.01); *H03G 3/3005* (2013.01); *H03G 3/3026* (2013.01); *H04R 3/00* (2013.01)

(58) Field of Classification Search
CPC .......... H03F 3/185; H03F 3/181; H03F 3/183; H03F 2200/03; H03F 2200/228;
(Continued)

(56) References Cited

U.S. PATENT DOCUMENTS

2004/0017921 A1 *  1/2004  Mantovani .............. H03G 5/22
                                                381/94.9
2004/0081099 A1 *  4/2004  Patterson ............... H04R 29/00
                                                370/241
(Continued)

FOREIGN PATENT DOCUMENTS

CN      101646114 A     2/2010
CN      102118668 A     7/2011
(Continued)

OTHER PUBLICATIONS

Augarten, "Charge-Recovery Circuit Maximizes Piezoelectric-Actuator Efficiency", Jan. 6, 2011, EDN https://m.eet.com/media/1155026/25782-charge_recovery_circuit_maximizes_piezoelectric_actuator_efficiency_pdf.pdf (Year: 2011).*

(Continued)

*Primary Examiner* — Yogeshkumar Patel
(74) *Attorney, Agent, or Firm* — Dority and Manning, P.A.

(57) ABSTRACT

An amplifier unit for operating a piezoelectric loudspeaker or microphone includes an audio amplifier and a detection unit, which is configured to detect whether a sound transducer coupled to the amplifier unit is a piezoelectric sound transducer or a dynamic sound transducer. The amplifier unit is configured in such a way that, after a sound transducer has been coupled, the amplifier unit sends a test signal to the coupled sound transducer. Moreover, a sound-generation (Continued)

unit includes a sound transducer and an amplifier unit, which amplifies an audio signal and feeds it to the sound transducer.

14 Claims, 2 Drawing Sheets

(51) Int. Cl.
*H03G 3/30* (2006.01)
*H03G 3/00* (2006.01)

(58) Field of Classification Search
CPC .. H03F 3/45071; H03G 3/3005; H03G 3/007; H03G 3/3026; H03G 3/20; H04R 3/00
See application file for complete search history.

(56) References Cited

U.S. PATENT DOCUMENTS

| | | | |
|---|---|---|---|
| 2006/0093153 A1* | 5/2006 | Yamamoto | H03F 3/20 |
| | | | 381/59 |
| 2007/0064955 A1 | 3/2007 | Saito | |
| 2009/0274312 A1* | 11/2009 | Howard | H04R 29/003 |
| | | | 381/58 |
| 2010/0315097 A1 | 12/2010 | Lesso | |
| 2014/0064520 A1 | 3/2014 | Kim | |
| 2018/0167719 A1 | 6/2018 | Hosaka et al. | |

FOREIGN PATENT DOCUMENTS

| | | |
|---|---|---|
| CN | 204190934 U | 3/2015 |
| JP | S59125199 A | 7/1984 |
| JP | 5990627 B1 | 12/2016 |

OTHER PUBLICATIONS

German Search Report, German Application No. 10 2016 120 545.1, dated Aug. 7, 2017, 13 pages.

International Search Report, PCT Application No. PCT/EP2017/077250, dated Jan. 23, 2018, 14 pages.

Chinese Office Action for Application No. 201780066235.2 and English Translation 21 pages.

* cited by examiner

AMPLIFIER UNIT FOR OPERATING A PIEZOELECTRIC SOUND TRANSDUCER AND/OR A DYNAMIC SOUND TRANSDUCER, AND A SOUND-GENERATING UNIT

TECHNICAL FIELD

The invention relates to an amplifier unit for operating a piezoelectric sound transducer and/or a dynamic sound transducer. The amplifier unit also comprises at least one audio amplifier. Moreover, the invention comprises a sound-generation unit including an amplifier unit, which amplifies an audio signal and feeds it to a sound transducer.

PRIOR ART

Amplifier units for sound transducers are known in the general related art. However, these amplifier units can be utilized only for a piezoelectric sound transducer or a dynamic sound transducer. It is disadvantageous in this case, on the one hand, that two associated amplifier units must also be present for the two sound transducers. On the other hand, it is problematic to identify the type of the sound transducer, i.e., piezoelectric or electrodynamic, when there is no information available in this regard. Moreover, damage can occur when a piezoelectric sound transducer is operated using an amplifier unit for a dynamic sound transducer, or vice versa.

BRIEF OBJECTS AND SUMMARY OF THE INVENTION

The problem addressed by the present invention is therefore that of eliminating these disadvantages.

The problem is solved using an amplifier unit and a sound-generation unit having the features described below.

The invention relates to an amplifier unit for operating a piezoelectric sound transducer and/or a dynamic sound transducer. The amplifier unit comprises at least one audio amplifier in this case. A sound transducer can include, in this case, a loudspeaker for generating sounds, music, and/or speech, and/or a microphone for picking up sounds, music, and/or speech.

According to the invention, the amplifier unit comprises a detection unit, with the aid of which it can be detected whether a sound transducer coupled to the amplifier unit is a piezoelectric sound transducer and/or a dynamic sound transducer. The detection unit can also detect the sound transducer in an automated manner. An audio signal for a piezoelectric sound transducer can be amplified, for example, in a different way than an audio signal for a dynamic sound transducer. When the type of sound transducer that is present is first identified, the audio signal can be amplified accordingly, so that a piezoelectric sound transducer and/or a dynamic sound transducer can be operated using an amplifier unit. As a result, the amplifier unit can be utilized in a flexible manner, since only one amplifier unit is utilized for a piezoelectric sound transducer and/or a dynamic sound transducer.

The amplifier unit is configured (i.e., programmed) in such a way that it sends a test signal to the at least one connected sound transducer. The test signal can be preferably sent by the amplifier unit in an automated manner after a sound transducer has been connected. The test signal is sent to the sound transducer in order to detect whether a piezoelectric sound transducer and/or dynamic sound transducer are/is connected to the amplifier unit.

The piezoelectric sound transducer can include, for example, a MEMS loudspeaker and/or a MEMS microphone. The piezoelectric sound transducer is based on the piezoelectric effect. The piezoelectric sound transducer includes a piezoelectric component, which is charged when a voltage is applied, whereas it deforms. Due to the deformations and, for example, a diaphragm, a sound can be generated. The piezoelectric component also comprises a capacitor, which is charged.

The dynamic sound transducer, however, can be based on the fact that a magnet is deflected with respect to a coil. By way of example, in a dynamic loudspeaker, a voltage is applied to the coil, which induces an electric current in the coil. The current in the coil results in a magnetic field, which attracts or repels the magnet, so that the magnet is deflected. The magnet can be connected to a diaphragm, so that the diaphragm is also deflected as part of the deflection. Due to the deflection, the sound is generated here. The dynamic sound transducer can have an inductor in this case. The dynamic sound transducer can also be an electrodynamic sound transducer.

In an advantageous enhanced embodiment of the invention, the amplifier unit includes a first audio amplifier for the piezoelectric sound transducer and a second audio amplifier for the dynamic sound transducer. As a result, the first audio amplifier can be optimized for the operation of the piezoelectric sound transducer and the second audio amplifier can be optimized for the operation of the dynamic sound transducer. As a result, the amplifier unit can be operated with a higher efficiency.

Moreover, it is advantageous when the amplifier unit includes at least one interface, via which at least one sound transducer is connected to the amplifier unit and/or to the detection unit. Additionally or alternatively, the at least one sound transducer can also be connected to the amplifier unit and/or the detection unit. The interface can also be wired. For example, the interface can be a socket for a plug.

It is also advantageous when the interface includes at least one test line for connecting the detection unit to the at least one sound transducer. As a result, the detection unit can be connected separately to the sound transducer.

Additionally or alternatively, the interface can include at least one audio line for connecting an audio amplifier to the at least one sound transducer. Via the audio line, the amplified audio signal can be routed to the sound transducer.

It is also advantageous when the interface is designed to be bidirectional, so that signals can be sent from the amplifier unit to the at least one sound transducer and can be received by the at least one sound transducer. The test line and/or the audio line can also be designed to be bidirectional in this case. When, for example, the sound transducer is designed as a microphone, the amplifier unit can receive signals from the microphone. As a result, an operation of the amplifier unit for loudspeakers and/or microphones is given.

It is also advantageous when the amplifier unit comprises a switching unit, with the aid of which at least one of the audio amplifiers can be selected. Additionally or alternatively, an audio signal can also be routed to the selected audio amplifier. When, for example, only a dynamic sound transducer is coupled to the amplifier unit, only the second audio amplifier can be selected in order to operate the dynamic sound transducer. In this case, the first audio amplifier remains inactive, so that energy can be saved.

Moreover, it is advantageous when the amplifier unit comprises a control unit for controlling the switching unit.

The control unit can be situated between the switching unit and the detection unit and/or can be electrically connected to the switching unit and the detection unit. As a result, the control unit can monitor the detection unit and, when the detection unit identifies the sound transducer, the control unit can control the switching unit accordingly.

It is also advantageous when the detection unit is configured (i.e., programmed) in such a way that it sends the test signal to the at least one connected sound transducer. Additionally or alternatively, the control unit can also be configured in such a way that it sends the test signal to the at least one connected sound transducer. The test signal can also be sent in an automated manner by the detection unit and/or the control unit after a sound transducer has been connected. The test signal is sent to the sound transducer in order to detect whether a piezoelectric sound transducer and/or dynamic sound transducer are/is connected to the amplifier unit.

In an advantageous enhanced embodiment of the invention, the detection unit is configured in such a way that it receives and/or analyzes a response signal of the sound transducer resulting from the test signal. The detection unit can distinguish between a capacitive response signal and an inductive response signal.

The sound transducer therefore receives the test signal and modifies it in such a way that the sound transducer returns the response signal. Additionally or alternatively, the sound transducer can also only modify the test signal and the detection unit detects the response signal.

For example, the detection unit detects the capacitive response signal. On the basis of this capacitive response signal, the detection unit can identify that a piezoelectric sound transducer has been connected to the amplifier unit. The piezoelectric sound transducer can be characterized, for example, by the fact that a piezoelectric component is situated therein. The piezoelectric component has a capacitor, which returns the capacitive response signal in response to the test signal. The piezoelectric component also has electrical properties, which are essentially similar to those of a capacitor. The detection unit can therefore apply, for example, a constant voltage to the sound transducer, as the test signal. After a charge time of the piezoelectric sound transducer, the piezoelectric sound transducer is charged, so that an electric current flow to the piezoelectric sound transducer comes to a halt. The response signal in this case is, therefore, the electric current coming to a halt. Additionally or alternatively, the detection unit can, for example, also measure the frequency-dependent resistance of the piezoelectric sound transducer, so that the capacitive response signal is, for example, the dependence of the resistance of the piezoelectric sound transducer on the frequency of a voltage.

An inductive response signal is present when a dynamic sound transducer is connected to the amplifier unit, wherein the detection unit can detect this response signal. The dynamic sound transducer can comprise, for example, a coil, which has an inductance. The detection unit can apply a constant voltage to the sound transducer once again, for example, as the test signal. If a coil is situated therein, after a certain charge time of the coil, a constant and non-zero electric current will form. The sound transducer therefore returns a constant current as the inductive response signal, which is an indication of the dynamic sound transducer. The detection unit can also measure the frequency-dependent resistance of the sound transducer in this case, however, in order to infer the dynamic sound transducer on the basis thereof.

It is also advantageous when the detection unit is configured in such a way that it identifies a piezoelectric sound transducer in the case of a capacitive response signal and it identifies a dynamic sound transducer in the case of an inductive response signal, and it transmits a corresponding result signal to the control unit. The detection of the response signal can be carried out in the manner described above. After the detection, the detection unit can transmit the result in the form of a result signal to the control unit.

Moreover, it is advantageous when the control unit is configured in such a way that it actuates the switching unit depending on the result signal, so that the audio signal can be routed to the first audio amplifier and/or to the second audio amplifier. If the control unit receives, for example, a result signal from the detection unit, which indicates that a piezoelectric sound transducer is connected, the control unit controls the switching unit in such a way that the audio signal is routed to the first audio amplifier. If the result signal additionally or alternatively indicates a dynamic sound transducer, the audio signal is routed to the second audio amplifier.

In addition, it is advantageous when the amplifier unit includes a power supply unit, with the aid of which a voltage can be made available to the first audio amplifier. Higher voltages can be required for operating a piezoelectric sound transducer, for example, than can be provided, for example, by an accumulator in a smartphone. In that case, voltages of 3 V to 4 V are usually delivered by the accumulator. A piezoelectric component situated in the piezoelectric sound transducer can require higher voltages, however. The higher voltage can be made available with the aid of the power supply unit. For example, the power supply unit comprises a charge pump and/or a step-up-converter for generating the higher voltage.

Moreover, it is also advantageous when the first audio amplifier includes an energy recovery unit, with the aid of which electrical energy can be recovered from the piezoelectric sound transducer. As described above, the piezoelectric sound transducer can comprise a capacitor. This capacitor is charged, for example, upon deflection of the piezoelectric component. When the piezoelectric component returns to a starting position, the capacitor is discharged once again, whereby energy is given off by the capacitor. This energy can be intermediately stored, at least intermittently, in the energy recovery unit for a further charging, saving energy as a result.

The invention further relates to a method for operating at least one sound transducer, in which an audio signal for the at least one sound transducer is amplified with the aid of an amplifier unit. The sound transducer can be, for example, a piezoelectric sound transducer and/or a dynamic sound transducer. The amplifier unit can be designed, in this case, according to one or multiple features of the preceding description and/or the following description.

According to the invention, it is detected, with the aid of a detection unit, whether the at least one sound transducer is a piezoelectric sound transducer or a dynamic sound transducer. Additionally or alternatively, thereupon, the amplifier unit will amplify the audio signal accordingly. Additionally or alternatively, the amplifier unit described in the description can also be operated using a method of this type.

Moreover, the invention relates to a sound-generation unit comprising at least one sound transducer and an amplifier unit. The at least one sound transducer can be a piezoelectric sound transducer and/or a dynamic sound transducer. The amplifier unit also amplifies an audio signal and feeds it to the sound transducer.

According to the invention, the amplifier unit is designed according to at least one feature of the preceding description and/or the following description.

In an advantageous enhanced embodiment of the invention, the sound transducer is fixedly or detachably connected to the amplifier unit.

For example, the sound transducer in a smartphone, tablet, and/or laptop is fixedly connected to the amplifier unit. In that case, the sound-generation unit is also integrated in the smartphone and/or laptop.

Additionally or alternatively, the sound transducer can also be situated in headphones or, for example, in another loudspeaker arrangement. For example, the headphones can be detachably connected to the smartphone, in order to play music from the smartphone. In this case, the amplifier unit detects whether a piezoelectric loudspeaker and/or a dynamic loudspeaker are/is situated in the headphones and amplifies an audio signal, which contains the music, in that the audio signal is fed to an audio amplifier for the piezoelectric loudspeaker and/or to an audio amplifier for the dynamic loudspeaker.

The invention relates to a method for an amplifier unit for operating a piezoelectric sound transducer and/or a dynamic sound transducer. The amplifier unit comprises at least one audio amplifier. Moreover, the amplifier unit is designed according to the preceding description, wherein the mentioned features can be present individually or in any combination. With the aid of a detection unit of the amplifier unit, it is detected, in particular, in an automated manner, whether a sound transducer coupled to the amplifier unit is a piezoelectric sound transducer or a dynamic sound transducer. As a result, the audio amplifier can amplify an audio signal for the sound transducer according to the type of the sound transducer. In addition, after a sound transducer has been connected, the amplifier unit sends, in particular, in an automated manner, a test signal to the at least one connected sound transducer, so that the type of sound transducer can be determined.

BRIEF DESCRIPTION OF THE DRAWINGS

Further advantages of the invention are described in the following exemplary embodiments. Wherein.

DESCRIPTION OF EXEMPLARY EMBODIMENTS OF THE INVENTION

Figure 1:
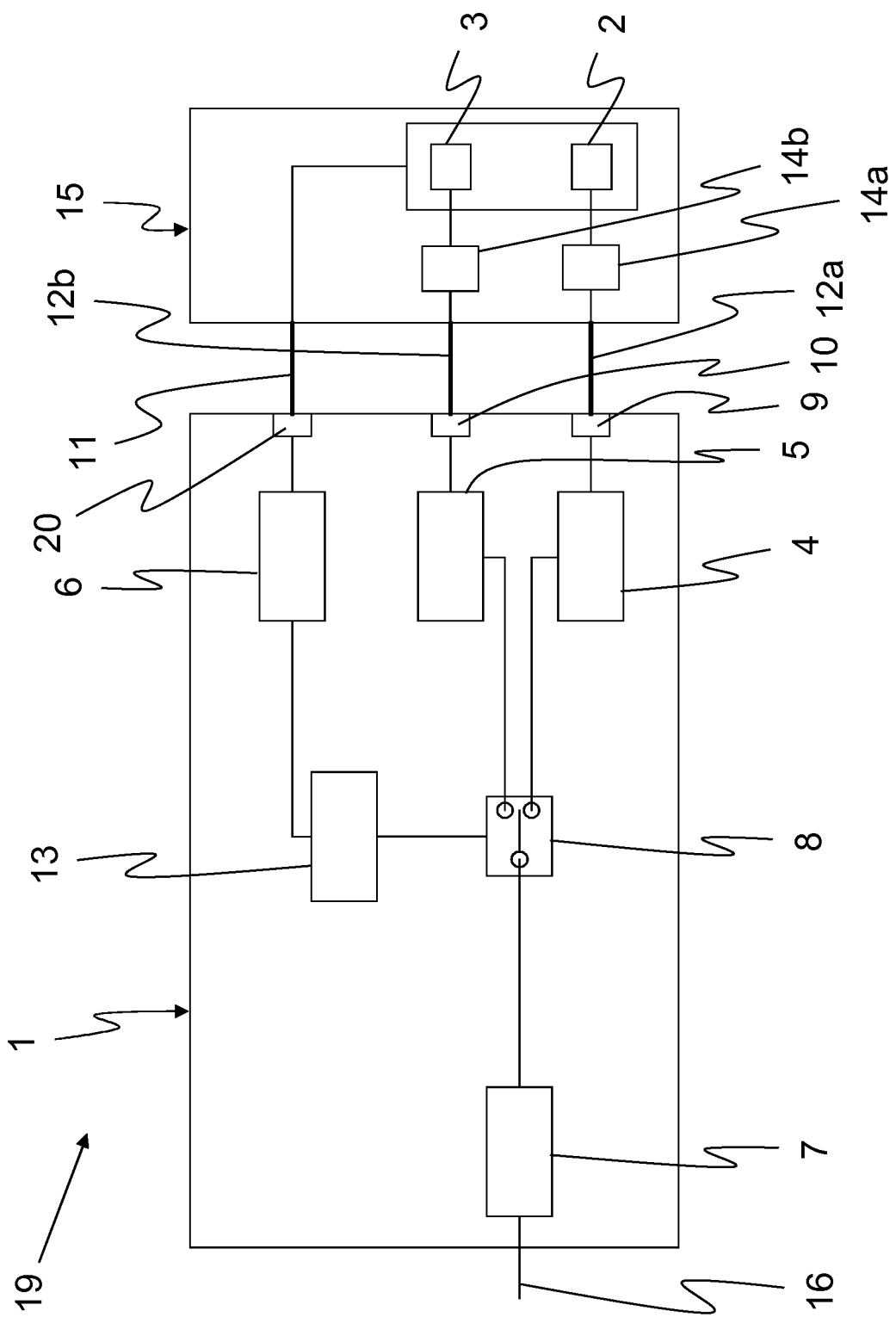
FIG. 1 shows a block diagram of an amplifier unit comprising sound transducers situated in an external unit.

FIG. 1 shows a block diagram of an amplifier unit 1, which is connected to sound transducers 2, 3 situated in an external unit 15. The amplifier unit 1 can be installed, for example, in a, in particular, mobile device, for example, a tablet or a mobile phone. The sound transducers 2, 3 can be a piezoelectric sound transducer 2 and/or a dynamic sound transducer 3 in this case. The two sound transducers 2, 3 can be, for example, loudspeakers, wherein the external unit 15 is designed, for example, as a loudspeaker box or as headphones. In this exemplary embodiment, both a piezoelectric sound transducer 2 and a dynamic sound transducer 3 are shown. The two sound transducers 2, 3 are shown for the purpose of explaining the functionality of the invention. In general, only one sound transducer 2 or 3 can be present, and/or both sound transducers 2 and 3 can be present.

The amplifier unit 1 is provided for the operation of the sound transducers 2, 3. The amplifier unit 1 is configured in such a way that it can amplify an audio signal and route it to the sound transducers 2, 3 in order to be output. The amplifier unit 1 comprises an input/output 16, via which, for example, the audio signal can be introduced into the amplifier unit 1. Additionally or alternatively, an audio signal can also be output via the input/output 16. For example, an audio signal can be output via the input/output 16 when sound is picked up with the aid of the sound transducers 2, 3. The sound transducers 2, 3 can include, for example, microphones for this purpose.

The following description essentially describes an exemplary embodiment, in the case of which the sound transducers 2, 3 include loudspeakers. In the following description, the audio signal is therefore routed from the input/output 16 to the sound transducers 2, 3. When the sound transducers 2, 3 additionally or alternatively comprise, for example, microphones, however, the audio signal is routed only from the sound transducers 2, 3 to the input/output 16, wherein the functionality of the components in the amplifier unit 1 is essentially the same. For example, after a sound has been picked up by the sound transducers 2, 3 (which include a microphone), the sound can be amplified by an audio amplifier 4, 5 and then routed further to the input/output 16.

Downstream from the input/output 16, the amplifier unit 1 comprises a signal preconditioning unit 7, in which the audio signal can be filtered and/or pre-amplified.

Situated downstream from the signal preconditioning unit 7 is a switching unit 8, which receives the processed audio signal from the signal preconditioning unit 7. In this exemplary embodiment, the switching unit 8 has two switching states. In one switching state, the audio signal is routed to a first audio amplifier 4. In the other switching state, the audio signal is routed to a second audio amplifier 5. The switching unit 8 can also have multiple switching states when, for example, multiple audio amplifiers are present. Additionally or alternatively, the switching unit 8 can also have a switching state in which the audio signal is routed to both audio amplifiers 4, 5.

The two audio amplifiers 4, 5 amplify the audio signal, so that the audio signal can be fed to the sound transducers 2, 3, respectively, and, for example, converted into sound, music, or speech. For this purpose, a first interface 9 is situated downstream from the audio amplifier 4. In addition, a second interface 10 is situated downstream from the audio amplifier 5. The interfaces 9, 10 are advantageously cabled, wherein an audio line 12a, 12b is routed from each of the interfaces 9, 10, respectively, to the external unit 15. The interfaces 9, 10 can be, for example, a USB, TRS, RCS, and/or XLR interface. Other interfaces are also conceivable, of course. With the aid of the cabled interfaces 9, 10, the energy required for the operation of the sound transducers 2, 3 can be conducted via the audio lines 12a, 12b, respectively, to the external unit 15. The external unit 15 then does not need to comprise a separate energy supply.

Moreover, the first audio amplifier 4 is connected to the piezoelectric sound transducer 2 via the first interface 9 and via the audio line 12a. The first audio amplifier 4 therefore operates the piezoelectric sound transducer 2.

Moreover, the second audio amplifier 5 is connected to the dynamic sound transducer 3 via the second interface 10 and via the audio line 12b. The second audio amplifier 5 therefore operates the dynamic sound transducer 3.

Moreover, the external unit 15 can also comprise filters 14a, 14b which are situated upstream from the sound transducers 2, 3, respectively, and, with the aid of which, the amplified audio signal can be processed and/or filtered.

Moreover, the amplifier unit 1 comprises a detection unit 6, with the aid of which it can be detected whether the sound transducers 2, 3 are a piezoelectric sound transducer 2 and/or a dynamic sound transducer 3. The detection unit 6 can also carry out the detection in an automated manner. As a result, it can be detected whether the piezoelectric sound transducer 2 and/or the dynamic sound transducer 3 are/is situated in the external unit 15. For this purpose, the detection unit 6 can send a test signal to the sound transducer 2, 3 to be detected, via a third interface 20 and a test line 11, which is designed to be cabled in this exemplary embodiment. The sound transducer 2, 3 modifies the test signal in a manner depending on which type of sound transducer 2, 3 it is, and returns the test signal, as a response signal, to the detection unit 6. The sound transducers 2, 3 do not need to actively return the response signal. For example, the detection unit 6 can detect how the sound transducers 2, 3 behave when the test signal is sent to the sound transducers 2, 3. This behavior can then be evaluated as a response signal.

The response signal to the test signal can be of capacitive nature, for example. On the basis thereof, the detection unit 6 can infer that a piezoelectric sound transducer 2 is situated in the external unit 15.

Additionally or alternatively, the response signal to the test signal can also be of inductive nature, so that the detection unit 6 infers therefrom that a dynamic sound transducer 3 is situated in the external unit 15.

The detection unit 6 can apply a constant voltage to the test line 11 to the sound transducers 2, 3, for example, as a test signal. The piezoelectric sound transducer 2 will return a resistance, which will be very high, for example, as a capacitive response signal after a certain time (which is conditional upon a charge time of a capacitor of the piezoelectric sound transducer). As a result, a current, which then flows to the piezoelectric sound transducer 2, is essentially zero. As a result, the detection unit 6 can detect that the piezoelectric sound transducer 2 is situated in the external unit 15.

However, when the detection unit 6 applies a constant voltage to the test line 11 to the sound transducers 2, 3 and receives an inductive response signal, the detection unit 6 can infer that a dynamic sound transducer 3 is present. Dynamic sound transducers 3 can comprise a coil, which returns the inductive response signal. The inductive response signal can be a constant, non-zero current, for example, when the voltage is constant, since the coil is a continuous conductor. The current can be limited, for example, by a line resistance or other components in the external unit 15. The detection unit 6 detects the constant, non-zero current and therefore infers that the dynamic sound transducer 3 is present in the external unit 15.

Additionally or alternatively, the test signal can also be sent to the sound transducers 2, 3 via the interfaces 9, 10, respectively, and via the audio lines 12*a*, 12*b*, respectively. For this purpose, the detection unit 6 is connected to the interfaces 9, 10.

Likewise additionally or alternatively, the response signal can also be returned to the detection unit 6 via the audio lines 12*a*, 12*b*. For this purpose, the detection unit 6 is connected to the interfaces 9, 10.

When the test signal is sent by the detection unit 6 via the interfaces 9, 10 and via the audio lines 12*a*, 12*b* to the sound transducers 2, 3, respectively, the test line 11 can be dispensed with. For example, after the external unit 15, including the sound transducers 2, 3, has been connected to the amplifier unit 1, and before, for example, music is played by the sound transducers 2, 3, the detection unit 6 can send the test signal via the interfaces 9, 10 and via the audio lines 12*a*, 12*b*, in order to detect the type of the sound transducers 2, 3, respectively. Additionally or alternatively, the response signal can also be returned to the detection unit 6 from the sound transducers 2, 3 via the audio lines 12*a*, 12*b*, respectively, and via the interfaces 9, 10, respectively. For example, the music can also be played only after the type of the sound transducers 2, 3 has been identified by the detection unit 6.

After the type of the sound transducers 2, 3 has been identified, the detection unit 6 can send an appropriate result signal to a control unit 13. The control unit 13 is connected to the switching unit 8, which can then be switched in such a way that, in the case of the capacitive response signal, the first audio amplifier 4 for the piezoelectric sound transducer 2 is connected. Additionally or alternatively, the control unit 13 can also switch the switching unit 8 in such a way that, in the case of the inductive response signal, the second audio amplifier 5 is connected, so that the dynamic sound transducer 3 is operated.

Moreover, the amplifier unit 1 and the external unit 15 form a sound generation unit 19. The external unit 15 can also be fixedly connected to the amplifier unit 1. In this case, the sound-generation unit 19 can be situated, for example, in a smartphone, a laptop, a tablet, or the like. The sound transducers 2, 3 can be the internal loudspeakers and/or microphones in this case. The amplifier unit 1 can be situated, for example, in an integrated circuit, for example, an ASIC, in the smartphone.

Additionally or alternatively, the external unit 15 can also be detachably connected to the amplifier unit 1. For example, the amplifier unit 1 can be situated in the smartphone. Moreover, the external unit 15 can be a set of headphones, which comprise the sound transducers 2, 3. The sound transducers 2, 3 can then include loudspeakers, so that, for example, music can be played. The sound transducers 2, 3 can additionally or alternatively also comprise microphones, so that, for example, speech can be picked up. For example, speech can be output and picked up with the aid of the sound transducers 2, 3.

Figure 2:
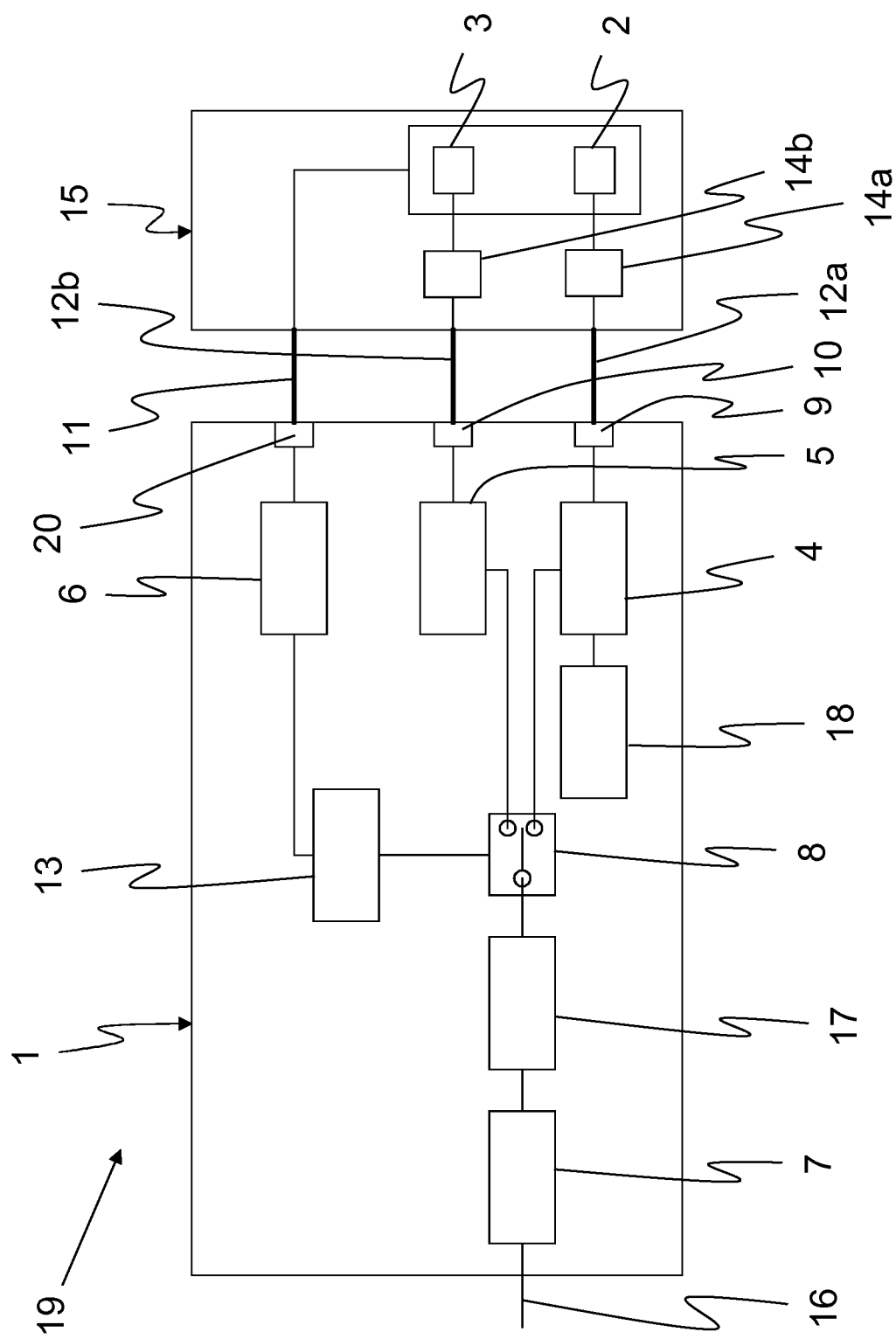
FIG. 2 shows a block diagram of an amplifier unit in an expanded exemplary embodiment.

FIG. 2 shows an amplifier unit 1 in an expanded exemplary embodiment. The amplifier unit 1 has essentially the same features as those shown in FIG. 1. Therefore, only the essential differences are to be addressed.

In this exemplary embodiment, a PWM unit 17 (pulse width modulation unit) is situated between the signal preconditioning unit 7 and the switching unit 8. With the aid of the PWM unit 17, the audio signal can be digitized after the signal preconditioning unit 7. The pulse-width modulated audio signal is then routed from the switching unit 8 to the first audio amplifier 4 and/or to the second audio amplifier 5. One advantage thereof is that an amplification of the pulse-width modulated audio signal can be carried out more efficiently by the audio amplifiers 4, 5. Energy can be saved as a result.

Moreover, the amplifier unit 1 in this exemplary embodiment comprises a power supply unit 18, which supplies the first audio amplifier 4 with voltage. The power supply unit 18 can generate higher voltages, for example, from low voltages, for example, of 3 volts to 4 volts. For this purpose, the power supply unit 18 can comprise, for example, an step-up-converter, which generates a higher voltage from the low voltage.

In addition, the first audio amplifier 4 and/or the power supply unit 18 can comprise an energy recovery unit (not shown here). With the aid thereof, electrical energy can be recovered from the piezoelectric sound transducer 2, which includes a capacitor. The recovered energy can be utilized once again for operating the piezoelectric sound transducer 2.

The present invention is not limited to the represented and described exemplary embodiments. Modifications within the scope of the claims are also possible, as is any combination of the features, even if they are represented and described in different exemplary embodiments.

LIST OF REFERENCE CHARACTERS 1 amplifier unit
2 piezoelectric sound transducer
3 dynamic sound transducer
4 first audio amplifier
5 second audio amplifier
6 detection unit
7 signal preconditioning unit
8 switching unit
9 first interface
10 second interface
11 test line
12 audio line
13 control unit
14 filter
15 external unit
16 input/output
17 PWM module
18 power supply unit
19 sound-generation unit
20 third interface

The invention claimed is:

1. An amplifier unit for operating a piezoelectric sound transducer and/or a dynamic sound transducer that becomes coupled to the amplifier unit, which comprises:
    a first audio amplifier and a second audio amplifier;
    a switching unit connected to the first audio amplifier and to the second audio amplifier, wherein the switching unit is configured for selecting one of the first audio amplifier and the second audio amplifier so that an audio signal is routed to the first audio amplifier if the sound transducer is the piezoelectric sound transducer or routed to the second audio amplifier if the sound transducer is the dynamic sound transducer;
    a detection unit connected to the first audio amplifier and to the second audio amplifier and configured for detecting whether a sound transducer that becomes coupled to the amplifier unit is a piezoelectric sound transducer or a dynamic sound transducer;
    an interface having a first test line connecting the detection unit to a sound transducer, the interface having a second line separate from the first test line and connecting the sound transducer to the amplifier unit;
    wherein the detection unit is configured in such a way that, after the sound transducer becomes coupled to the amplifier unit, then the detection unit sends a first test signal to the coupled sound transducer and receives from the coupled sound transducer a response signal from which the detection unit determines whether the coupled sound transducer is a piezoelectric sound transducer or a dynamic sound transducer.

2. The amplifier unit as claimed in claim 1, wherein one of the first audio amplifier and the second audio amplifier is configured for operating one of a piezoelectric sound transducer and a dynamic sound transducer.

3. The amplifier unit as in claim 1, further comprising a cabled interface configured for connecting the sound transducer to the amplifier unit and/or to the detection unit.

4. The amplifier unit as claimed in claim 3, wherein the cabled interface comprises a test line configured for connecting the detection unit to the sound transducer or an audio line configured for connecting one of the first audio amplifier and the second audio amplifier to the coupled sound transducer.

5. The amplifier unit as claimed in claim 3, wherein the cabled interface includes a test line and/or the audio line configured to be bidirectional, so that signals can be sent from the amplifier unit to the coupled sound transducer and can be received by the coupled sound transducer.

6. The amplifier unit as claimed in claim 1, further comprising a control unit configured for controlling the switching unit and electrically connected to the switching unit and the detection unit.

7. The amplifier unit as claimed in claim 6, wherein the control unit is configured in such a way that, after a sound transducer has been coupled to the amplifier unit, then the control unit sends a second test signal to the coupled sound transducer.

8. The amplifier unit as claimed in claim 7, wherein the detection unit is configured in such a way that the detection unit analyzes a response signal of the coupled sound transducer resulting from the first test signal, wherein the detection unit is configured to distinguish between a capacitive response signal and an inductive response signal.

9. The amplifier unit as claimed in claim 8, wherein the detection unit is configured in such a way that it identifies a piezoelectric sound transducer in the case of a capacitive response signal and it identifies a dynamic sound transducer in the case of an inductive response signal, and it transmits a corresponding result signal to the control unit.

10. The amplifier unit as claimed in claim 9, wherein the control unit is configured in such a way that the control unit actuates the switching unit depending on the corresponding result signal, so that an audio signal can be routed to the first audio amplifier and/or to the second audio amplifier.

11. The amplifier unit as claimed in claim 1, further comprising a power supply unit, with the aid of which a voltage can be made available to at least one of the first audio amplifier and the second audio amplifier.

12. The amplifier unit as claimed in claim 1, wherein at least one of the first audio amplifier and the second audio amplifier includes an energy recovery unit, with the aid of which electrical energy can be recovered from the coupled piezoelectric sound transducer.

13. A sound-generation unit comprising:
    a sound transducer and
    an amplifier unit that is coupled to the sound transducer and which amplifies an audio signal and feeds it to the sound transducer wherein the amplifier unit includes:
    a first audio amplifier and a second audio amplifier; and
    a switching unit connected to the first audio amplifier and to the second audio amplifier, wherein the switching unit is configured for selecting one of the first audio amplifier and the second audio amplifier so that an audio signal is routed to the first audio amplifier if the sound transducer is the piezoelectric sound transducer or routed to the second audio amplifier if the sound transducer is the dynamic sound transducer;
    a detection unit connected to the first audio amplifier and to the second audio amplifier and configured for detecting whether a sound transducer that becomes coupled to the amplifier unit is a piezoelectric sound transducer or a dynamic sound transducer; and an interface having a first test line connecting the detection unit to a sound transducer, the interface having a second line separate from the first test line and connecting the sound transducer to the amplifier unit;

wherein the detection unit is configured in such a way that, after a sound transducer has become coupled to the amplifier unit, the detection unit sends a test signal to the coupled sound transducer and receives from the coupled sound transducer a response signal from which the detection unit determines whether the coupled sound transducer is a piezoelectric sound transducer or a dynamic sound transducer.

14. An operating method for an amplifier unit for operating a piezoelectric sound transducer and/or a dynamic sound transducer, which becomes coupled to the amplifier unit that comprises a detection unit connected to a first audio amplifier and a second audio amplifier and comprises a switching unit connected to the first audio amplifier and to the second audio amplifier, wherein the switching unit is configured for selecting one of the first audio amplifier and the second audio amplifier so that an audio signal is routed to the first audio amplifier if the sound transducer is the piezoelectric sound transducer or routed to the second audio amplifier if the sound transducer is the dynamic sound transducer, the method comprising the steps of:

after a sound transducer has become coupled to the amplifier unit via a second line, sending a test signal via a first test line from the detection unit to the coupled sound transducer in an automated manner wherein the first test line is separate from the second line;

the detection unit receiving a response signal from the coupled sound transducer;

the detection unit analyzing the response signal to determine whether the coupled sound transducer is a piezoelectric sound transducer or a dynamic sound transducer; and the switching unit operating to route the audio signal to the first audio amplifier if the detected sound transducer is the piezoelectric sound transducer or to the second audio amplifier if the detected sound transduce is the dynamic sound transducer.

* * * * *